US007223620B2

(12) United States Patent
Jäger et al.

(10) Patent No.: US 7,223,620 B2
(45) Date of Patent: May 29, 2007

(54) PROCESS FOR THE PRODUCTION OF LIGHT-EMITTING DIODE LIGHT SOURCES WITH A LUMINESCENCE CONVERSION ELEMENT

(75) Inventors: Harald Jäger, Regensburg (DE); Herbert Brunner, Regensburg (DE)

(73) Assignee: Osram Opto Semiconductor GmbH, Regensburg (DE)

( * ) Notice: Subject to any disclaimer, the term of this patent is extended or adjusted under 35 U.S.C. 154(b) by 95 days.

(21) Appl. No.: 10/735,507

(22) Filed: Dec. 11, 2003

(65) Prior Publication Data

US 2005/0196886 A1  Sep. 8, 2005

(30) Foreign Application Priority Data

Dec. 12, 2002  (DE) ................ 102 58 193

(51) Int. Cl.
*H01L 21/027* (2006.01)
(52) U.S. Cl. ............... 438/27; 438/31; 438/42
(58) Field of Classification Search .......... 438/22, 438/26, 27, 31, 42
See application file for complete search history.

(56) References Cited

U.S. PATENT DOCUMENTS

| | | | |
|---|---|---|---|
| 6,066,861 A | 5/2000 | Hohn | |
| 6,410,980 B1 * | 6/2002 | Tsuji | ............ 257/701 |
| 6,614,103 B1 * | 9/2003 | Durocher et al. | ........... 257/678 |
| 6,787,435 B2 * | 9/2004 | Gibb et al. | .......... 438/507 |
| 6,861,281 B2 * | 3/2005 | Uemura et al. | ............ 438/93 |
| 6,869,813 B2 * | 3/2005 | Okazaki | ............ 438/22 |
| 7,023,019 B2 * | 4/2006 | Maeda et al. | .............. 257/89 |
| 2002/0142058 A1 | 10/2002 | Tanaka et al. | |
| 2002/0195935 A1 | 12/2002 | Jager et al. | |
| 2003/0173575 A1 | 9/2003 | Eisert et al. | |

FOREIGN PATENT DOCUMENTS

| | | |
|---|---|---|
| DE | 199 63 806 A1 | 7/2001 |
| DE | 100 08 203 A1 | 8/2001 |

(Continued)

OTHER PUBLICATIONS

Pinckney, L.R., "Ceramics and Glass", Engineered Materials Handbook, vol. 4, ASM International, pp. 433-438.

*Primary Examiner*—M. Wilezewski
*Assistant Examiner*—Pamela E Perkins
(74) *Attorney, Agent, or Firm*—Cohen Pontani Lieberman & Pavane LLP

(57) ABSTRACT

A plurality of light-emitting diode light sources of the same kind are produced simultaneously. Each light source includes a light-emitting diode chip and a luminescence conversion element, which converts the wavelength of at least part of an electromagnetic radiation emitted by the light-emitting diode chip. In a first process, a layer composite with a light-emitting diode layer sequence applied to a carrier substrate is provided. The wafer is provided with trenches and then inserted into a cavity of a mold. A molding compound, which contains a luminescence conversion material, is driven in, so that the trenches are at least partly filled with the molding compound. The mold is then removed and the light-emitting diode light sources are separated from the layer composite. In a second process, instead of the layer composite, a plurality of light-emitting diode chips which are applied to a common carrier in a regular arrangement are provided.

26 Claims, 3 Drawing Sheets

FOREIGN PATENT DOCUMENTS

| | | | |
|---|---|---|---|
| DE | 100 06 738 A1 | | 9/2001 |
| JP | 62-004380 | * | 1/1987 |
| JP | 2002-043625 | * | 2/2002 |
| JP | 2002-118293 | | 4/2002 |
| WO | WO 97/50132 | | 12/1997 |
| WO | WO 98/12757 | | 3/1998 |
| WO | WO 01/39282 A2 | | 11/2000 |
| WO | WO 01/50540 A1 | | 12/2000 |

* cited by examiner

PROCESS FOR THE PRODUCTION OF LIGHT-EMITTING DIODE LIGHT SOURCES WITH A LUMINESCENCE CONVERSION ELEMENT

RELATED APPLICATIONS

This patent application claims the priority of German Patent Application 10258193.2, whose disclosure content is hereby incorporated by reference.

FIELD OF THE INVENTION

The invention relates to a process for a simultaneous production of a plurality of light-emitting diode light sources of the same kind, in which the wavelength of at least part of a primary radiation emitted by a light-emitting diode chip is converted.

BACKGROUND OF THE INVENTION

A light source with a luminescence conversion element is disclosed, for example, in WO 97/50132. It comprises a semiconductor chip which, during operation, emits primary radiation of which part is converted into light of a different wavelength by the luminescence conversion element. The resulting, optically perceivable radiation from the light-emitting diode light source is given by a mixture of the two radiations, so that, as a result, in particular light sources which also emit white light can be produced. The luminescence conversion material has at least one light-emitting material which is embedded in a matrix material.

There are a plurality of known methods for arranging the luminescence conversion material within the path of light emission from the light-emitting diode chip. One possibility is to mix light-emitting material with a potting compound, as described for example in the Laid-Open Specification WO 98/12757. The light-emitting diode chip is in this case mounted on a pre-housed leadframe and is then covered with the wavelength-converting potting compound. The color locus of light (CIE color chart) that is emitted from light-emitting diode light sources produced in accordance with such a process can vary even though such light sources are produced in the same way. The causes for this can be sedimentation formation of the light-emitting material in the potting compound or different thicknesses of the luminescence-converting potting compound over the light-emitting diode chips.

Such problems can be eliminated to some extent by light-emitting diode chips mounted on a leadframe being encapsulated in a luminescence conversion compound, as shown for example in DE 199 63 806 A1. In this case, when a molding technique is used for the light-emitting material, use can be made of a molding compound with a higher viscosity, which cures more quickly. As a result, sedimentation formation of the light-emitting material occurs to a lesser extent. In addition, by means of such a production process, it is possible to dispense with a prefabricated housing, which means a considerable ability to miniaturize light-emitting diode light sources.

As a result of using a mold, light-emitting diode light sources of the same overall height are obtained. However, this leads to luminescence conversion layers of different thicknesses on the chips since, even in the case of light-emitting diode chips from the same wafer composite, it is possible for height fluctuations to occur of, for example, up to 20 μm. A further disadvantage of molding techniques is high production costs since, with high investment costs for the installation and tools, there is only a low yield per production cycle.

SUMMARY OF THE INVENTION

One object of the present invention is to develop a process which makes it possible to have a cost-effective production of light-emitting diode light sources, including a luminescence conversion element, with low color locus fluctuations among light-emitting diode light sources of the same kind.

According to an aspect of the invention, a plurality of light-emitting diode light sources of the same kind, each having a light-emitting diode chip and a luminescence conversion unit, which converts the wavelength of at least some of a radiation emitted by the light-emitting diode chip, are produced simultaneously by the luminescence conversion material being applied substantially simultaneously to the light-emitting diode chips by means of a molding technique before the chips are mounted on a housing or housing part.

For the plurality of light-emitting diode chips, a layer composite comprising a light-emitting diode layer sequence applied to a carrier substrate is provided. In the process, a plurality of trenches are produced in the layer composite. The layer composite is then inserted into a cavity of a mold, into which a molding compound is driven in a further step. This molding compound has mixed with it a luminescence conversion material and is driven into the cavity in such a way that the trenches are at least partly filled with it. The mold is then removed and the light-emitting diode light sources are separated from the layer composite.

This process makes it possible to combine the advantages of a molding technique with the simultaneous production of many light-emitting diode light sources of the same kind, which results in a considerable reduction in the production costs.

The luminescence conversion material can contain at least one fluorescent material. Suitable for this purpose are, for example, inorganic light-emitting materials such as garnets doped with rare earths (in particular Ce), or organic light-emitting materials, such as perylene light-emitting materials. Further suitable fluorescent materials are listed, for example, in WO 98/12757, whose content to this extent is hereby incorporated by reference.

During the process, the layer composite can expediently be a wafer composite or light-emitting diode chips.

The trenches can advantageously be formed along dividing lines between regions of adjacent light-emitting diode chips on the layer composite.

The trenches are expediently produced by sawing.

In a preferred embodiment of the process according to the invention, the inner walls of at least some of the trenches are formed in such a way that parts of the bottom surfaces do not run parallel with, and/or parts of the side walls do not run at right angles to, the front or rear surface of the light-emitting diode chip. As a result, at least part of the chip surface can be given a shape, such that the electromagnetic radiation that is emitted strikes the chip surface at the lowest possible angle of incidence, which is advantageous for outcoupling of the radiation.

In this case, particular preference is given to an embodiment of the process in which the bottom surfaces of at least some of the trenches are formed to be V-shaped, convex, concave or stepped, and at least part of the action of coupling light out from the light-emitting diode chips takes place via the bottom surfaces of the trenches.

According to another aspect of the invention, a plurality of light-emitting diode chips, which are fitted to a common carrier in a regular arrangement, are provided. These are inserted into a cavity of a mold, into which a molding compound with which a luminescence conversion material is mixed is subsequently driven. The molding compound is driven in in such a way that free space in the cavity is at least partly filled with it. The mold is then removed and the light-emitting diode light sources are separated.

A flexible carrier is preferably used in this case.

In a preferred embodiment implementing the second aspect of the invention, side flanks of at least some light-emitting diode chips are formed in such a way that parts of them do not run at right angles to the front or rear surface of the light-emitting diode chip.

These side flanks are particularly preferably formed in such a way that parts of them run obliquely with respect to the perpendicular to the front or rear surface of the light-emitting diode chip, or curved or stepped. Side flanks formed in this way can be advantageous for coupling out electromagnetic waves.

In a particularly preferred form of the processes according to the invention, the molding compound is a transfer molding compound, and the mold is a transfer mold. As a result of the use of transfer molding, more rapid curing of the molding compound is generally achieved than in the case of injection molding, which can lead to a lower tendency to sedimentation of the light-emitting material.

In a preferred embodiment of the process, the cavity is formed in such a way that inner walls of the mold rest on the front and rear of the layer composite or of the chips. As a result, the front and rear of the layer composite or the chips are covered only to a slight extent with molding compound, or not at all, instead only the trenches or interspaces between the chips are filled with molding compound. Both the trenches and interspaces between the chips may be produced in a well-defined manner, so that the covering of the side flanks of the light-emitting diode light sources exhibits little fluctuation. Color locus fluctuations on account of a layer of molding compound of different thickness on the chip surfaces, which arises as a result of different chip heights in molding techniques, are avoided to the greatest extent as a result.

The layer composite located on the carrier is inserted into the cavity in such a way that it rests with the rear side on the inner wall of the mold. Alternatively, the light-emitting diode chips located on the carrier are inserted into the cavity in such a way that they rest with the rear side on the inner wall of the mold. This results in the additional possibility of applying the molding compound to the front surface of the layer composite or the light-emitting diode chips.

In a preferred embodiment of the processes according to the invention, the layer composite or the light-emitting diode chips have electrical contact areas on the front to which, before the insertion of the layer composite or the light-emitting diode chips into the cavity, an electrical connecting material of approximately constant height is applied. The electrical contacts elevated in this way act as spacers between the front surface of the layer composite or of the light-emitting diode chips and the inner wall of the mold. As a result, when the molding compound is driven into the cavity of the mold, not only are the flanks of the light-emitting diode chips but also these front surfaces are covered uniformly with molding compound, apart from the elevated electrical contacts.

In a preferred embodiment of the invention, the molding compound by which electrical contacts are covered can be removed by being thinned. This is expediently done at least until the affected electrical contacts are exposed.

In a particularly advantageous embodiment of the processes, electrical connecting material is applied to the front electrical contact areas. After the molding process, molding compound is subsequently thinned and thus partly removed from the contact areas. In this case, the color locus (CIE color chart) of the light-emitting diode light sources can be measured repeatedly and thus be set specifically by the thinning of the molding compound.

In order to prevent undesired coverage of electrical contact areas with molding compound, these can be sealed off before the insertion of the layer composite or the light-emitting diode chips into the cavity, and can be exposed again before being separated.

In a preferred embodiment of the processes, the electrical contact areas are sealed off by means of films, which are applied to the front and/or rear surface of the layer composite respectively the light-emitting diode chips.

Alternatively, the electrical contact areas are sealed off by means of a front and/or rear inner wall of the mold, which mold comprises part plates fitted such that they can move, which are pressed individually against the front and/or rear of the layer composite or of the light-emitting diode chips. By means of such a device, height fluctuations in the layer composite or the chips are compensated for, so that the walls of the mold rest more closely on each front and/or rear surface and thus seal off the latter better. It is also conceivable to alternatively use an elastic or plastically deformable insert.

In a preferred development of the processes according to the invention, the position and color locus of the light-emitting diode light sources is subsequently determined and registered. The light-emitting diode light sources are then sorted in accordance with their color locus. By means of such pre-sorting, in particular all failed chips are removed, as a result of which possible subsequent processes, such as the automated making of contact with the light-emitting diode light sources with a bonding wire, are accelerated considerably.

The light-emitting diode light sources produced in accordance with the processes can subsequently be mounted on a leadframe and encapsulated in a translucent or transparent material.

Alternatively, the finished light-emitting diode light sources are very well suited to be mounted in a pre-housed leadframe. They are then covered with a translucent or transparent potting compound.

DETAILED DESCRIPTION OF THE DRAWINGS

In the exemplary embodiments, constituent parts of the same kind or constituent parts comprising the same functionality are in each case provided with the same designations.

Figure 1:
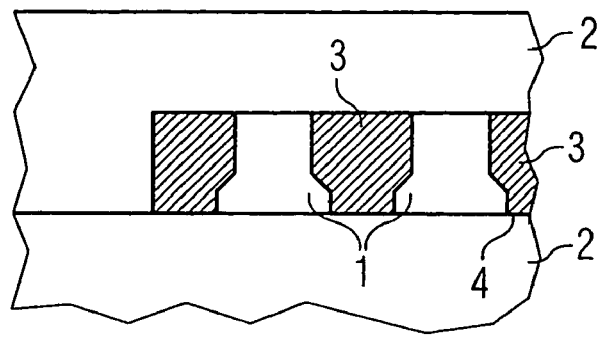
FIG. 1 shows an exemplary embodiment of the process according to the invention using a schematic sectional view of a mold with inserted layer composite.

In FIG. 1, light-emitting diode chips 1 are inserted into a cavity of a mold 2. The light-emitting diode chips comprise an epitaxial semiconductor layer sequence based on InGaN with a radiation-emitting active zone (not shown). The active zone has, for example, a radiation-producing pn junction or a radiation-producing simple or multiple quantum structure. Such structures are known to those skilled in the art and will therefore not be explained specifically. A suitable multiple quantum structure is described, for example, in WO 01/39282 A2, whose content to this extent is incorporated by reference.

Figure 7:
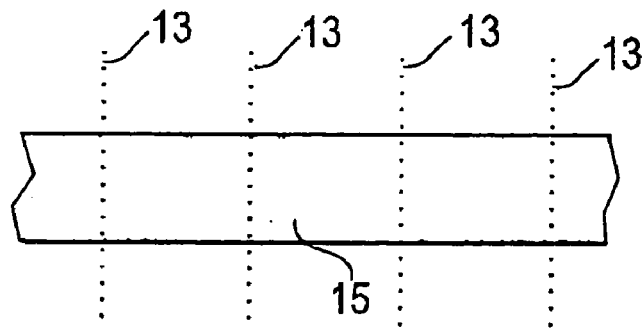
FIGS. 7 to 9 show different steps of separating a layer composite into light emitting diode chips according to one embodiment of the process according to the invention.

The epitaxial layer sequence is grown onto a substrate to form a layer composite 15, which is shown in FIG. 7. The layer composite 15 is subsequently separated into a multitude of light emitting diode chips.

Figure 8:
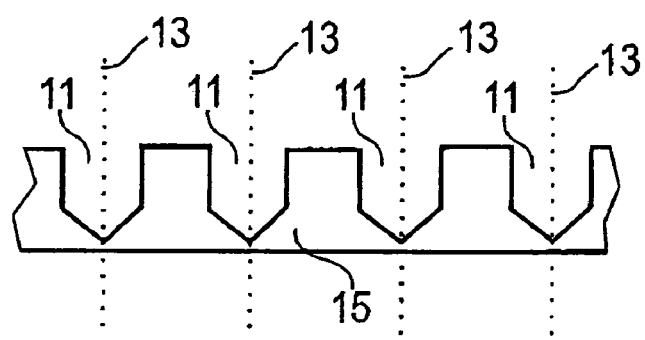
Figure 9:
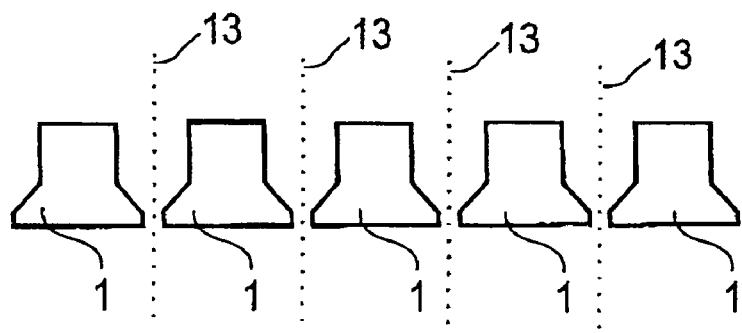

In FIG. 1, the light-emitting diode chips 1, before being inserted into the cavity of mold 2, have already been separated from layer composite 15 in such a way (e.g., by etching or sawing) that part of their side flanks runs obliquely with respect to their front or rear surfaces. The particular angles depend on the specific chip design, e.g., the chip size. The choice of an appropriate angle is within the capability of one with ordinary skill in the art and, thus, further details with respect thereto are not deemed necessary. This can be achieved in that, trenches 11 whose base is V-shaped are formed along dividing lines 13 between regions of the light-emitting diode chips 1 in the unseparated layer composite 15, as shown in FIG. 8. The trenches 11 can be produced by sawing, using a saw blade whose end tapers in a V shape. Subsequently, the chips 1 are separated from the layer composite 15 along the trenches 11 or the separating lines 13, which is shown in FIG. 9.

The light-emitting diode chips 1 are applied to a carrier film 4, with which they are clamped into the mold 2 as shown in FIG. 1. The molding compound 3 is driven into the cavity of the mold 2, as a result of which the interspaces between the light-emitting diode chips 1 are filled completely. The molding compound used can be, for example, a polymer pressing compound based on resin, which is substantially composed of a pre-reacted epoxy resin, in particular an epoxy novolak or epoxy cresol novolak, and is applied by transfer molding. Examples of such a molding compound are described in WO 01/50540 A1, whose content to this extent is incorporated by reference. The molding compound can have added to it at least one light-emitting material which, for example, can be inorganic light-emitting materials, such as garnets doped with rare earths (in particular Ce), or organic light-emitting materials, such as perylene light-emitting materials. After at least partial curing of the molding compound 3, the light-emitting diodes light sources are taken out of the mold 2, removed from the carrier film 4 and separated again, which can be done by sawing, for example.

Figure 4:
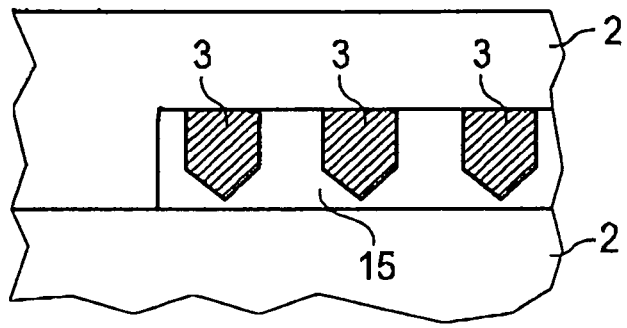
FIG. 4 shows a third exemplary embodiment of the process according to the invention using a schematic sectional view of a mold with inserted light-emitting diode chips.

Alternatively, the light-emitting diode chips 1 can be not quite severed before being inserted into the mold 2 and, instead, still cohere to each other via the layer composite 15, as shown in FIG. 4. This is ensured, for example, if trenches are only produced in the layer composite 15 and the chips 1 are not separated from the layer composite 15.

Figure 2:
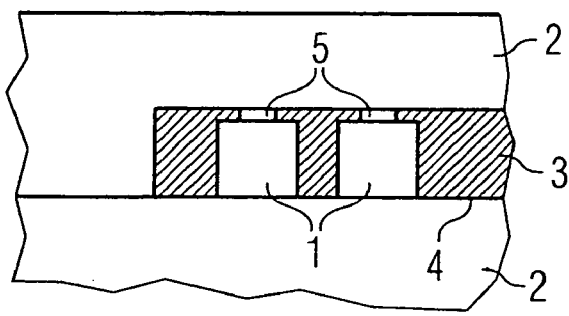
FIG. 2 shows a second exemplary embodiment of the process according to the invention using a schematic sectional view of a mold with inserted light-emitting diode chips.

In the examplary embodiment of FIG. 2, the light-emitting diode chips 1 have already been separated from a layer composite by sawing before being inserted into the mold 2, and have been applied to a carrier film 4. It differs from the exemplary embodiment explained previously by using FIG. 1 in the shape of the side flanks of the chips and in the fact that electrically conductive material 5 of approximately the same height has been applied to the front contact areas (not shown) of the light-emitting diode chips, serving as spacers between the inner wall of the mold and the chip surface, and as a method of making electrical contact.

The light-emitting diode chips 1 are clamped into the mold 2 with the aid of a carrier film 4, so that the inner wall of the mold 2 rests on the electrically conductive material. The electrically conductive material 5 is preferably soft, so that, when the inner walls of the mold 2 rest closely on it, differences in the heights of the light-emitting diode chips 1 can be compensated for by pressing the part plates of the mold 2 together and by slight deformation of the electrically conductive material 5. A molding compound 3 to which the luminescence converter has been added is then driven into the cavity of the mold 2, so that the interspaces between the light-emitting diode chips 1 are filled up completely. When the molding compound 3 has at least partly cured, the light-emitting diodes light sources can be taken out of the mold 2, removed from the carrier film 4 and separated by sawing.

Figure 5:
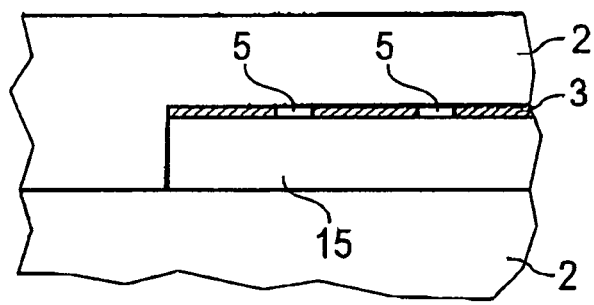
FIG. 5 shows a fourth exemplary embodiment of the process according to the invention using a schematic sectional view of a mold with inserted light-emitting diode chips

Alternatively, it is possible not to separate the light emitting diode chips from the layer composite 15 but to insert the unseparated layer composite 15 into the cavity of the mold 2, as shown in FIG. 5. The subsequent steps are conducted as explained above in connection with FIG. 2. This alternative examplary embodiment of the invention yields light sources with light emitting diode chips whose side flanks are not covered with molding compound 3.

Before the separation of the light-emitting diode light sources, the color locus and position are preferably determined and registered. It is advantageous to determine the color locus before separation because it is easier to handle a wafer and contact the chip regions within a wafer than to handle a plurality of individual chips. Following the separation, the light sources are sorted in accordance with their color locus by using this data.

Figure 3:
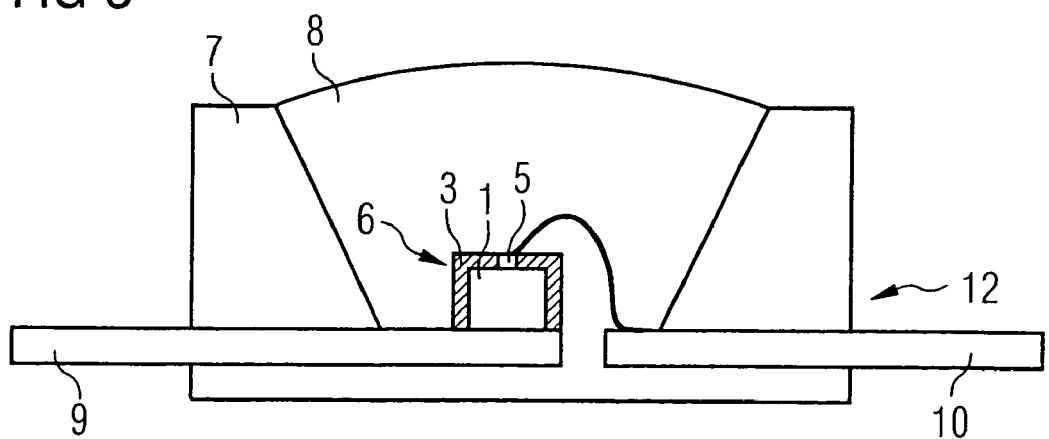
FIG. 3 shows an exemplary embodiment of a component having a light-emitting diode light source which has been produced according to one embodiment of the process according to the invention.

The component in FIG. 3 contains a pre-housed leadframe 12 which has a housing 7 and two electrical leads 9 and 10, in which a light-emitting diode light source 6 produced in accordance with the exemplary embodiment in FIG. 2 is mounted. "Pre-housed" means that the housing is formed before the diode light source 6 is mounted on the leads 9, 10 of the leadframe. After the diode light source 6 has been mounted on the leadframe, the light-emitting diode light source 6 is covered with a translucent or transparent potting compound 8 which, for example, can have an epoxy, silicone or acrylate casting resin or a mixture of such resins. Such potting compounds are known to those skilled in the art and will not be explained further here. If the electrically conductive material 5 is covered at the front by luminescence conversion material 3 (e.g. because some luminescence conversion material may creep into small gaps between the inner wall of mold 2 and the electrically conductive material), this is removed by thinning before the light-emitting diode light source 6 is mounted in the pre-housed leadframe 12, the thinning preferably being carried out, for example by means of grinding, at the same time in all the light-emitting diode light sources 6 applied to a carrier film.

Figure 6:
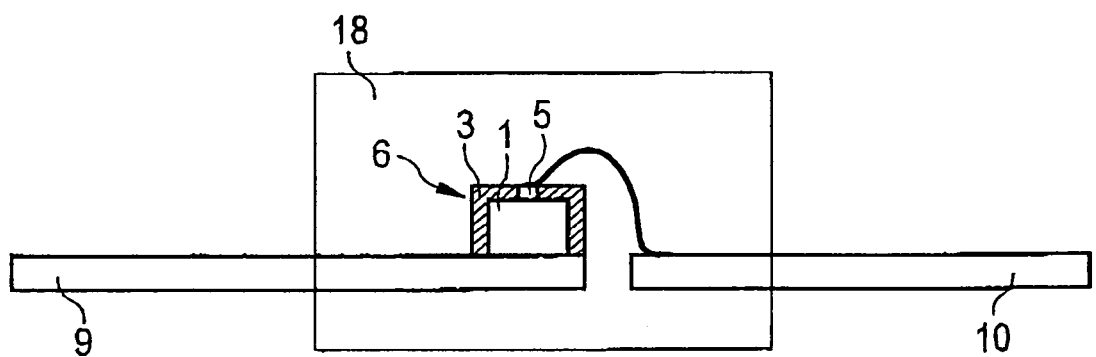
FIG. 6 shows an exemplary embodiment of a component having a light-emitting diode light source which has been produced according to one embodiment of the process according to the invention.

Alternatively, the light-emitting diode light source 6 can be mounted on a leadframe (leads 9, 10) and then, together with a part of the leadframe, can be completely encapsulated in a translucent or transparent press compound 18, which serves as a housing. An examplary design for this alternative is shown in FIG. 6.

The protective scope of the invention is not restricted by the description of the invention using the exemplary embodiments. Instead, the invention comprises every new feature and every combination of features which, in particular, includes every combination of features in the patent claims, even if this combination is not specified explicitly in the patent claims.

We claim:

1. A process for simultaneously producing a plurality of light-emitting diode light sources of the same kind, each comprising a light-emitting diode chip and a luminescence conversion element, which converts the wavelength of at least part of an electromagnetic radiation emitted by the light-emitting diode chip, wherein the process comprises:
   providing a layer composite with a light-emitting diode layer sequence applied to a carrier substrate for the plurality of light-emitting diode chips;
   producing a plurality of trenches in the layer composite,
   inserting the layer composite into a cavity of a mold,
   driving a molding compound, containing a luminescence conversion material, into the cavity in such a way that the trenches are at least partly filled with the molding compound,
   removing the mold, and
   separating the light-emitting diode light sources from the layer composite.

2. A process for simultaneously producing a plurality of light-emitting diode light sources of the same kind, each comprising a light-emitting diode chip and a luminescence conversion element, which converts the wavelength of at least part of an electromagnetic radiation emitted by the light-emitting diode chip, wherein the process comprises:
   providing a plurality of light-emitting diode chips, which are applied to a common carrier in a regular arrangement;
   inserting the light-emitting diode chips into a cavity of a mold,
   driving a molding compound, containing a luminescence conversion material, into the cavity in such a way that free space of the cavity is at least partly filled with the molding compound,
   removing the mold, and
   separating the light-emitting diode light sources.

3. The process as claimed in claim 1, in which the layer composite is a wafer composite of light-emitting diode chips.

4. The process as claimed in claim 1, in which the trenches are formed along dividing lines between regions of adjacent light-emitting diode chips in the layer composite.

5. The process as claimed in claim 1, in which the trenches are produced by sawing.

6. The process as claimed in claim 1, in which the inner walls of at least some of the trenches are formed in such a way that parts of the bottom surfaces do not run parallel with, and/or parts of the side walls do not run at right angles to, front or rear surfaces of the light-emitting diode chips.

7. The process as claimed in claim 1, in which bottom surfaces of at least some of the trenches are formed so as to be V-shaped, convex, concave or stepped, and at least part of the light is coupled out of the light-emitting diode chips via the bottom surfaces of the trenches.

8. The process as claimed in claim 2, in which the carrier is flexible.

9. The process as claimed in claim 2, in which side flanks of at least some light-emitting diode chips are formed in such a way that parts of them do not run at right angles to front or rear surface of the light-emitting diode chips.

10. The process as claimed in claim 2, in which the side flanks of at least some of the light-emitting diode chips are formed in such a way that parts of them run obliquely with respect to the perpendicular to front or rear surfaces of the light-emitting diode chips, curved or stepped.

11. The process as claimed in claim 1 or 2, in which the molding compound is a transfer molding compound and the mold is a transfer mold.

12. The process as claimed in claim 1 or 2, in which the light-emitting diode chips and/or the light-emitting diode light sources are separated by sawing.

13. The process as claimed in claim 1 or 2, in which the cavity is formed in such a way that the inner walls of the mold rest on the front and the rear of the layer composite respectively the chips.

14. The process as claimed in claim 1 or 2, in which the layer composite is inserted into the cavity in such a way that it rests with the rear on the inner wall of the mold.

15. The process as claimed in claim 1 or 2, in which the layer composite has electrical contact areas on the front side, to which, before the insertion of the layer composite into the cavity, an electrical connecting material with an approximately constant height is applied.

16. The process as claimed in claim 1 or 2, in which molding compound by which electrical contacts are covered is removed by thinning, at least until the electrical connecting material is exposed.

17. The process as claimed in claim 15, in which molding compound applied to the front is thinned at least until covered electrical connecting material is exposed, and in which the color locus (CIE color chart) of the light-emitting diode light sources is measured repeatedly and thus set specifically by means of further thinning.

18. The process as claimed in claim 1 or 2, in which electrical contact areas of the layer composite or of the light-emitting diode chips are sealed off before they are inserted into the cavity and exposed again before being separated.

19. The process as claimed in claim 18, in which the electrical contact areas are sealed off by means of films, which are applied to the front and/or rear surface of the layer composite respectively the light-emitting diode chips.

20. The process as claimed in claim 18, in which the electrical contact areas of the chips are sealed off by a front and/or rear inner wall of the mold, which comprises part plates fitted such that they can move, which are pressed individually against the front and/or rear of the layer composite or the light-emitting diode chips.

21. The process as claimed in claim 1 or 2, in which the position and color locus of the light-emitting diode light sources are subsequently determined and registered and the light-emitting diode light sources are subsequently sorted in accordance with their color locus.

22. A component comprising at least one light-emitting diode light source which is produced in accordance with one of the processes as claimed in claim 1 or 2, in which the light-emitting diode light sources are mounted on a leadframe and subsequently encapsulated in a translucent or transparent material.

23. A component comprising at least one light-emitting diode light source which is produced in accordance with one of the processes as claimed in claim 1 or 2, in which the light-emitting diode light sources are mounted on a pre-housed leadframe and covered with a translucent or transparent potting compound.

24. The process as claimed in claim 1 or 2, in which the light-emitting diode chips are inserted into the cavity in such a way that they rest with the rear on the inner wall of the mold.

25. The process as claimed in claim 1 or 2, in which the light-emitting diode chips have electrical contact areas on the front side, to which, before the insertion of the layer composite or the light-emitting diode chips into the cavity, an electrical connecting material with an approximately constant height is applied.

26. A process for simultaneously producing a plurality of light-emitting diode light sources of the same kind, each comprising a light-emitting diode chip and a luminescence conversion element, which converts the wavelength of at least part of an electromagnetic radiation emitted by the light-emitting diode chip, wherein the process comprises:

providing a plurality of light-emitting diode chips, which are applied to a common carrier;

inserting the light-emitting diode chips into a cavity of a mold without mounting said light-emitting diode chips on a housing;

driving a molding compound, containing a luminescence conversion material, into the cavity in such a way that free space of the cavity is at least partly filled with the molding compound;

removing the mold; and separating the light-emitting diode light sources.

* * * * *